(12) United States Patent
Wu et al.

(10) Patent No.: US 11,387,387 B2
(45) Date of Patent: Jul. 12, 2022

(54) MICRO LIGHT EMITTING DEVICE DISPLAY APPARATUS

(71) Applicant: PlayNitride Display Co., Ltd., MiaoLi County (TW)

(72) Inventors: Chih-Ling Wu, MiaoLi County (TW); Yen-Yeh Chen, MiaoLi County (TW); Yi-Min Su, MiaoLi County (TW); Yi-Chun Shih, MiaoLi County (TW); Bo-Wei Wu, MiaoLi County (TW); Yu-Yun Lo, MiaoLi County (TW); Ying-Ting Lin, MiaoLi County (TW); Tzu-Yang Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 62 days.

(21) Appl. No.: 16/862,582

(22) Filed: Apr. 30, 2020

(65) Prior Publication Data
US 2020/0259050 A1 Aug. 13, 2020

Related U.S. Application Data

(63) Continuation-in-part of application No. 16/659,584, filed on Oct. 22, 2019, now Pat. No. 11,094,849.
(Continued)

(30) Foreign Application Priority Data

Oct. 13, 2017 (TW) .................................. 106135067
Dec. 30, 2019 (TW) .................................. 108148260

(51) Int. Cl.
*H01L 33/38* (2010.01)
*H01L 25/075* (2006.01)
*H01L 33/40* (2010.01)

(52) U.S. Cl.
CPC ........ *H01L 33/387* (2013.01); *H01L 25/0753* (2013.01); *H01L 33/382* (2013.01); *H01L 33/40* (2013.01)

(58) Field of Classification Search
CPC ....... H01L 25/167; H01L 33/54; H01L 33/62; H01L 25/0753; H01L 33/42; H01L 33/44;
(Continued)

(56) References Cited

U.S. PATENT DOCUMENTS 11,094,849 B2 * 8/2021 Wu ....................... H01L 33/387
2008/0308820 A1 12/2008 Louwsma et al.
(Continued)

FOREIGN PATENT DOCUMENTS

CN 108666337 10/2018
CN 109244100 1/2019
(Continued)

OTHER PUBLICATIONS

"Office Action of Taiwan Counterpart Application", dated Apr. 30, 2020, p. 1-p. 7.
"Office Action of China Counterpart Application", dated Apr. 26, 2021, p. 1-p. 10.

*Primary Examiner* — Thanh T Nguyen
(74) *Attorney, Agent, or Firm* — JCIPRNET

(57) ABSTRACT

A micro light emitting device display apparatus including a circuit substrate, a plurality of micro light emitting devices, a first common electrode layer, and a second common electrode layer is provided. The micro light emitting devices are disposed on the circuit substrate and individually include an epitaxial structure and a first-type electrode and a second-type electrode respectively disposed on two side surfaces of the epitaxial structure opposite to each other. The first common electrode layer is disposed on the circuit substrate and directly covers the plurality of first-type electrodes of the micro light emitting devices. The second common elec-
(Continued)

trode layer is disposed between the micro light emitting devices. The first common electrode layer is electrically connected to the second common electrode layer.

20 Claims, 9 Drawing Sheets

Related U.S. Application Data which is a continuation-in-part of application No. 15/869,098, filed on Jan. 12, 2018, now Pat. No. 10,490,536.

(58) Field of Classification Search
CPC ....... H01L 33/20; H01L 33/387; H01L 33/40; H01L 33/382; H01L 33/505; H01L 33/507
See application file for complete search history.

(56) References Cited

U.S. PATENT DOCUMENTS

| | | | |
|---|---|---|---|
| 2010/0258822 A1* | 10/2010 | Kobayashi | H01L 25/0753 257/88 |
| 2017/0033268 A1* | 2/2017 | Lee | H01L 33/32 |
| 2018/0277591 A1* | 9/2018 | Wu | H01L 33/60 |

FOREIGN PATENT DOCUMENTS

| | | |
|---|---|---|
| CN | 109390412 | 2/2019 |
| CN | 109671732 | 4/2019 |
| CN | 109671821 | 4/2019 |
| CN | 110246931 | 9/2019 |
| CN | 110491896 | 11/2019 |
| JP | 2019129226 | 8/2019 |
| TW | 201507212 | 2/2015 |
| TW | 201926300 | 7/2019 |

* cited by examiner

MICRO LIGHT EMITTING DEVICE DISPLAY APPARATUS

CROSS-REFERENCE TO RELATED APPLICATION

This application is a continuation-in-part application of and claims the priority benefit of U.S. application Ser. No. 16/659,584, filed on Oct. 22, 2019, now pending, which is a continuation-in-part application of and claims the priority benefit of U.S. application Ser. No. 15/869,098, filed on Jan. 12, 2018, now patented. The prior U.S. application Ser. No. 15/869,098 claims the priority benefit of Taiwan application serial no. 106135067, filed on Oct. 13, 2017. This application also claims the priority benefit of Taiwan application serial no. 108148260, filed on Dec. 30, 2019. The entirety of each of the above-mentioned patent applications is hereby incorporated by reference herein and made a part of this specification.

BACKGROUND OF THE INVENTION

Field of the Invention

The invention relates to a display device, and more particularly, to a micro light emitting device display apparatus using a micro light emitting device as a display pixel.

Description of Related Art

In recent years, the manufacturing cost of an organic light emitting diode (OLED) display panel has been high and the service life thereof cannot compete with current mainstream displays, and therefore a micro light emitting diode display (micro LED display) has gradually attracted investment from various technology companies. The micro light emitting diode display has optical performance equivalent to that of organic light emitting diode display techniques, such as high color saturation, fast response speed, and high contrast, and has advantages of low energy consumption and long material life. Generally speaking, the display pixels of the micro light emitting diode display panel are formed by at least one micro light emitting diode. The electrodes on one side of these micro light emitting diodes are electrically connected to each other via a common electrode extended in the display region to achieve a common potential.

At present, in the production of the common electrode, indium tin oxide (ITO) with a high work function between 4.5 eV and 5.3 eV, stable characteristics, and high light transmittance is usually selected as the electrode material. However, since the circuits and devices on the circuit substrate are not resistant to high temperatures, this type of common electrode cannot be subjected to a high-temperature annealing procedure, such that the light transmittance and conductivity of the common electrode cannot be improved. If the film thickness of the common electrode is increased in order to meet operational conductivity requirements, the light transmittance is further reduced. Therefore, how to solve the above issues is one of the important topics for concerned manufacturers.

SUMMARY OF THE INVENTION

The invention provides a micro light emitting device display apparatus having a common electrode with a lower resistance value and better light emitting efficiency.

A micro light emitting device display apparatus of the invention includes a circuit substrate, a plurality of micro light emitting devices, a first common electrode layer, and a second common electrode layer. The micro light emitting devices are disposed on the circuit substrate and individually include an epitaxial structure and a first-type electrode and a second-type electrode respectively disposed on two side surfaces of the epitaxial structure opposite to each other. The first common electrode layer is disposed on the circuit substrate and directly covers the plurality of first-type electrodes of the micro light emitting devices. The second common electrode layer is disposed on the first common electrode layer and located between the micro light emitting devices. The first common electrode layer is electrically connected to the second common electrode layer.

In an embodiment of the invention, a conductivity of the second common electrode layer of the micro light emitting device display apparatus is higher than a conductivity of the first common electrode layer.

In an embodiment of the invention, a visible light transmittance of the first common electrode layer of the micro light emitting device display apparatus is greater than a visible light transmittance of the second common electrode layer.

In an embodiment of the invention, a thickness of the first common electrode layer of the micro light emitting device display apparatus is less than a thickness of the second common electrode layer.

In an embodiment of the invention, a material of the first common electrode layer of the micro light emitting device display apparatus includes a metal oxide, and a material of the second common electrode layer includes a metal or an alloy.

In an embodiment of the invention, the second common electrode layer of the micro light emitting device display apparatus has a width in a first direction. Two adjacent micro light emitting devices have a maximum pitch and a minimum pitch in the first direction. The width of the second common electrode layer is greater than or equal to the minimum pitch and less than the maximum pitch.

In an embodiment of the invention, a ratio of the width of the second common electrode layer of the micro light emitting device display apparatus to the maximum pitch is greater than or equal to 0.5.

In an embodiment of the invention, a ratio of the width of the second common electrode layer of the micro light emitting device display apparatus to the minimum pitch is greater than or equal to 0.5 and less than or equal to 2.

In an embodiment of the invention, a width of the second common electrode layer of the micro light emitting device display apparatus in a first direction is greater than or equal to a width of the first-type electrode in the first direction.

In an embodiment of the invention, a thickness of the second common electrode layer of the micro light emitting device display apparatus is less than or equal to a thickness of the first-type electrode.

In an embodiment of the invention, a conductivity of the first common electrode layer of the micro light emitting device display apparatus is less than a conductivity of the first-type electrode.

In an embodiment of the invention, a visible light transmittance of the first common electrode layer of the micro light emitting device display apparatus is greater than a visible light transmittance of the first-type electrode.

In an embodiment of the invention, the micro light emitting device display apparatus further includes an isolation layer disposed between the plurality of micro light emitting devices. The first common electrode layer is disposed on the isolation layer. The second common electrode layer is located between the first common electrode layer and the isolation layer. There is a first height between a surface of the second common electrode layer connected to the first common electrode layer and the circuit substrate. There is a second height between a surface of the first-type electrode connected to the first common electrode layer and the circuit substrate, and the first height is greater than the second height.

In an embodiment of the invention, the micro light emitting device display apparatus further includes a wavelength conversion layer disposed between the second common electrode layer. The isolation layer has a plurality of grooves correspondingly disposed on the plurality of micro light emitting devices, and the wavelength conversion layer is filled in the grooves.

In an embodiment of the invention, the micro light emitting device display apparatus further includes an isolation layer and a gap. The isolation layer is disposed between the plurality of micro light emitting devices. The first common electrode layer is disposed on the isolation layer, and the second common electrode layer is located between the first common electrode layer and the isolation layer. The gap is located between the micro light emitting devices, the isolation layer, and the circuit substrate.

In an embodiment of the invention, each of the micro light emitting devices of the micro light emitting device display apparatus further includes an insulating layer. The insulating layer is disposed between the epitaxial structure and the isolation layer and covers at least a portion of the epitaxial structure.

In an embodiment of the invention, the micro light emitting device of the micro light emitting device display apparatus has a minimum width and a maximum width in a first direction, and a ratio of the minimum width to the maximum width of the micro light emitting device is less than or equal to 0.5 and greater than or equal to 0.05.

In an embodiment of the invention, the micro light emitting device of the micro light emitting device display apparatus has a maximum width in the first direction. Two adjacent micro light emitting devices in the first direction have a maximum pitch, and the maximum pitch is less than the maximum width of the micro light emitting device.

In an embodiment of the invention, the epitaxial structure of the micro light emitting device display apparatus includes a first-type semiconductor layer, a light emitting layer, and a second-type semiconductor layer. The light emitting layer is located between the first-type semiconductor layer and the second-type semiconductor layer, and the second common electrode layer is overlapped with the light emitting layer in a direction parallel to the circuit substrate.

In an embodiment of the invention, the second common electrode layer of the micro light emitting device display apparatus has a plurality of grooves correspondingly disposed on the plurality of micro light emitting devices.

In an embodiment of the invention, the micro light emitting device display apparatus further includes a wavelength conversion layer. The wavelength conversion layer is disposed between the second common electrode layer and filled in the plurality of grooves.

Based on the above, in the micro light emitting device display apparatus of an embodiment of the invention, the common electrode of the plurality of first-type electrodes electrically connected to the plurality of micro light emitting devices is a stacked structure formed by the first common electrode layer and the second common electrode layer. Via the electrical connection between the first common electrode layer and the second common electrode layer disposed between the micro light emitting devices, the overall resistance of the common electrode may be effectively reduced, thus improving the current conduction efficiency of the common electrode.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
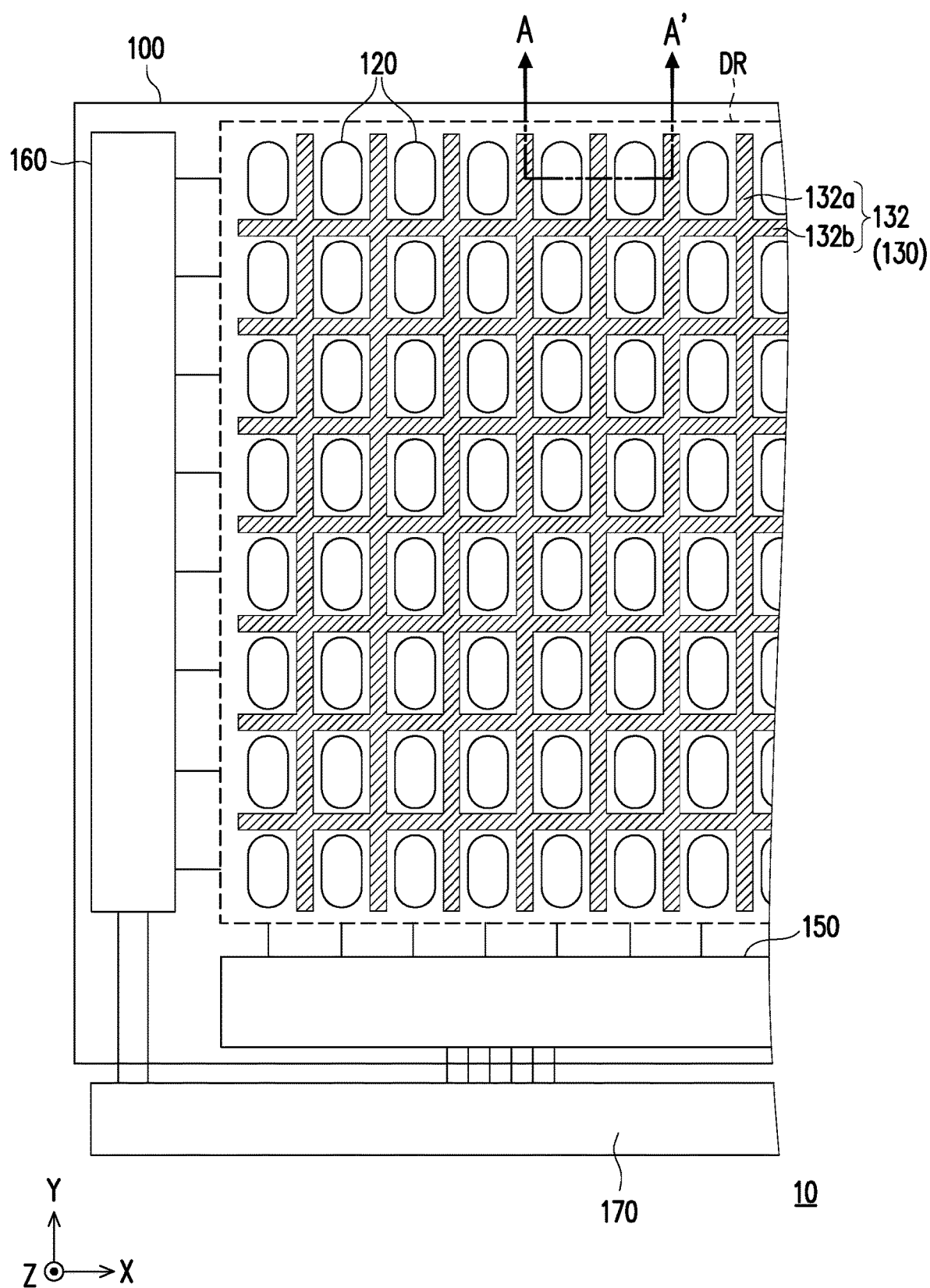
FIG. 1 is a top view of a micro light emitting device display apparatus of the first embodiment of the invention.

In the figures, for clarity, the thicknesses of, for example, layers, films, panels, and regions are enlarged. It should be understood that, when a layer, film, region, or a device of a substrate is "on" another device or "connected to" another device, the device may be directly on the other device or connected to the other device, or an intermediate device may also be present. On the other hand, when a device is "directly on another device" or "directly connected to" another device, an intermediate device is not present. As used in the present specification, "connected to" may refer to a physical and/or electrical connection. Furthermore, "electrically connected" may mean that other devices are present between two devices.

Hereinafter, exemplary embodiments of the invention are described in detail, and examples of the exemplary embodiments are conveyed via the figures. Wherever possible, the same reference numerals are used in the figures and the descriptions to refer to the same or similar portions.

Figure 2:
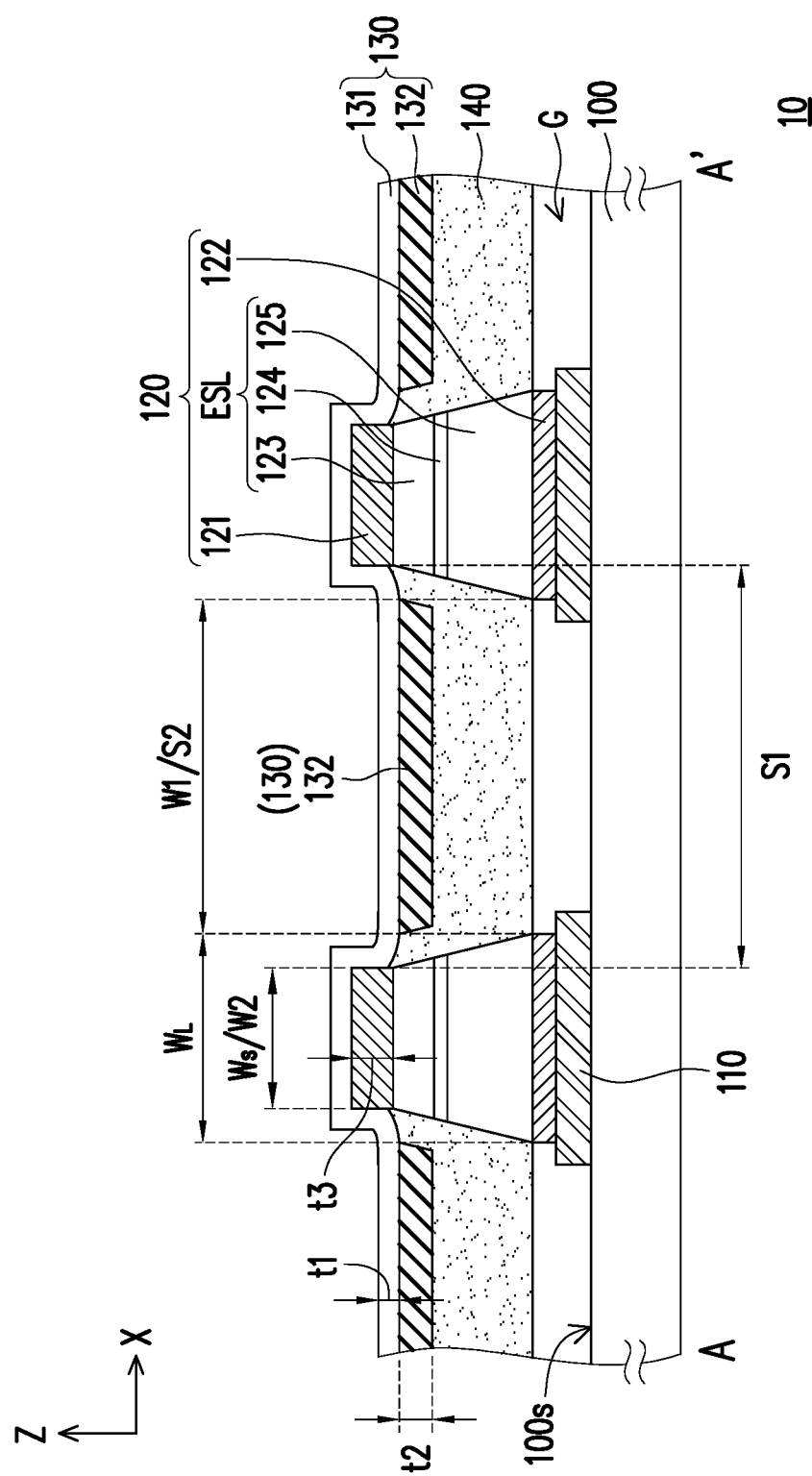
FIG. 2 is a cross-sectional view of the micro light emitting device display apparatus of FIG. 1.

FIG. 1 is a top view of a micro light emitting device display apparatus of the first embodiment of the invention. FIG. 2 is a cross-sectional view of the micro light emitting device display apparatus of FIG. 1. FIG. 2 corresponds to section line A-A' of FIG. 1. In particular, for the sake of clarity, FIG. 1 omits the illustration of connection pads 110, an isolation layer 140, and a first common electrode layer 131 of FIG. 2.

Referring to FIG. 1 and FIG. 2, a micro light emitting device display apparatus 10 includes a circuit substrate 100, a plurality of micro light emitting devices 120, and a common electrode 130. The plurality of micro light emitting devices 120 and the common electrode 130 are disposed on the circuit substrate 100, and the common electrode 130 covers the micro light emitting devices 120. More specifically, the circuit substrate 100 has a plurality of connection pads 110 located in a display region DR, and the connection pads 110 are distributed on a surface 100s of the circuit substrate 100. The plurality of micro light emitting devices 120 are electrically bonded to the connection pads 110 of the circuit substrate 100, respectively. In other words, the micro light emitting devices 120 are electrically connected to the circuit substrate 100 via the connection pads 110. In the present embodiment, the plurality of micro light emitting devices 120 (or the connection pads 110) are disposed on the circuit substrate 100 in an array arrangement, but the invention is not limited thereto.

In the present embodiment, the circuit substrate 100 may be a display substrate, a light emitting substrate, a substrate with a functional device such as a thin-film transistor or an integrated circuit (IC), or other types of circuit substrates. That is, the circuit substrate 100 includes a substrate and a driving circuit layer disposed on the substrate, wherein the driving circuit layer includes, for example, a transistor device, a capacitor, a scan line, a data line, and a power line, and the connection pads 110 are, for example, a portion of the data line or conductive patterns connected to the data line. That is, the driving circuit layer may be an active driving circuit layer, but the invention is not limited thereto. According to other embodiments, the driving circuit layer may also not include a transistor device. That is, the driving circuit layer may also be a passive driving circuit layer.

In detail, the micro light emitting devices 120 include an epitaxial structure ESL, a first-type electrode 121, and a second-type electrode 122. The first-type electrode 121 and the second-type electrode 122 are respectively disposed on two side surfaces of the epitaxial structure ESL opposite to each other. In the present embodiment, the first-type electrode 121 may be a light-transmissive electrode, and the material of the light-transmissive electrode may include a metal oxide, such as indium tin oxide, indium zinc oxide, aluminum tin oxide, aluminum zinc oxide, or other suitable oxides, or stacked layers of at least two of the above. The material of the second-type electrode 122 may include aluminum, copper, platinum, nickel, titanium, gold, silver, chromium, an alloy of the above metals, a high work function metal of a combination of the above alloys, a metal oxide, or a non-metallic conductive material such as a conductive polymer, graphite, graphene, or black phosphorus.

Further, the epitaxial structure ESL includes a first-type semiconductor layer 123, a light emitting layer 124, and a second-type semiconductor layer 125. The first-type semiconductor layer 123 is located between the first-type electrode 121 and the light emitting layer 124, and the first-type semiconductor layer 123 is electrically connected to the common electrode 130 via the first-type electrode 121. The second-type semiconductor layer 125 is located between the second-type electrode 122 and the light emitting layer 124, and the second-type semiconductor layer 125 is electrically connected to the connection pads 110 via the second-type electrode 122. More specifically, the second-type electrode 122, the epitaxial structure ESL, and the first-type electrode 121 of the present embodiment are sequentially stacked on the circuit substrate 100. That is, the micro light emitting devices 120 of the present embodiment are vertical-type micro light emitting diodes.

For example, the micro light emitting devices 120 have a maximum width $W_L$ and a minimum width $W_S$ in a direction X, and the ratio of the minimum width $W_S$ to the maximum width $W_L$ of the micro light emitting devices 120 is less than or equal to 0.5 and greater than or equal to 0.05, so that the display screen of the micro light emitting device display apparatus 10 has a finer resolution, but is not limited thereto. In the present embodiment, the maximum width $W_L$ of the micro light emitting devices 120 may be between 1 micron and 100 microns, preferably between 1 micron and 30 microns. In a preferred embodiment, the maximum width $W_L$ of the micro light emitting devices 120 is less than 10 microns. In another preferred embodiment, the maximum width $W_L$ of the micro light emitting devices 120 is less than 5 microns.

In the present embodiment, the connection surface of the epitaxial structure ESL (or the first-type semiconductor layer 123) and the first-type electrode 121 may define the minimum width $W_S$ of the micro light emitting devices 120, and the connection surface of the epitaxial structure ESL (or the second-type semiconductor layer 125) and the second-type electrode 122 may define the maximum width $W_L$ of the micro light emitting devices 120. More specifically, the width of the epitaxial structure ESL of the micro light emitting devices 120 may be gradually reduced from the second-type electrode 122 toward the direction of the first-type electrode 121, so that the cross-sectional profile of the epitaxial structure ESL is a positive trapezoid with a narrow top and a wide bottom to increase the process margin of the common electrode 130 in a later process.

Moreover, the first-type semiconductor layer 123 in the present embodiment is, for example, a P-type semiconductor layer, and the second-type semiconductor layer 125 is, for example, an N-type semiconductor layer. However, the invention is not limited thereto. According to other embodiments, the first-type semiconductor layer may also be an N-type semiconductor layer, and the second-type semiconductor layer may also be a P-type semiconductor layer. For example, the thickness of the first-type semiconductor layer 123 may be between 0.05 microns and 0.5 microns, the thickness of the light emitting layer 124 may be between 0.1 microns and 1 micron, and the thickness of the second-type semiconductor layer 125 may be between 1 micron and 5 microns. Accordingly, the overall thickness of the epitaxial structure ESL may be controlled between 1 micron and 6 microns to ensure the yield of subsequent processes and the characteristics of the end product.

Further, the micro light emitting device display apparatus 10 may further include the isolation layer 140 disposed between the plurality of micro light emitting devices 120, and the common electrode 130 directly covers the isolation layer 140 and the first-type electrode 121 of the micro light emitting devices 120. It is worth noting that the common electrode 130 has a stacked structure of the first common electrode layer 131 and a second common electrode layer 132 electrically connected to each other. The second common electrode layer 132 is located between the plurality of micro light emitting devices 120. More specifically, the second common electrode layer 132 is not overlapped with the micro light emitting devices 120 in a direction (e.g., a direction Z) perpendicular to the surface 100s of the circuit substrate 100, and the second common electrode layer 132 is located between the isolation layer 140 and the first common electrode layer 131. Moreover, the material of the isolation layer 140 may include an insulating material such as a light-sensitive material (such as a photoresist), a heat-sensitive material (such as a polymer glue), silicon oxide ($SiO_x$), aluminum oxide ($Al_2O_3$), aluminum nitride (AlN), or silicon nitride ($SiN_x$), but is not limited thereto.

In the present embodiment, the second common electrode layer 132 has a plurality of first straight line segments 132a and a plurality of second straight line segments 132b, and the first straight line segments 132a and the second straight line segments 132b are intersected. For example, the first straight line segments 132a are arranged in the direction X and extended in a direction Y, and the second straight line segments 132b are arranged in the direction Y and extended in the direction X, wherein the direction X is intersected with the direction Y. In other words, the second common electrode layer 132 of the present embodiment has a mesh distribution.

Specifically, in the present embodiment, the conductivity of the second common electrode layer 132 may be higher than the conductivity of the first common electrode layer 131. For example, the material of the first common electrode layer 131 may include transparent metal oxides, such as indium tin oxide (ITO), indium zinc oxide (IZO), aluminum tin oxide (ATO), aluminum zinc oxide (AZO), or other suitable oxides, or stacked layers of at least two of the above. The material of the second common electrode layer 132 may include silver, gold, chromium, copper, platinum, tin, nickel, titanium, aluminum, or an alloy of the above metals. Since the second common electrode layer 132 of the common electrode 130 is made of a metal material, the ratio of the conductivity of the second common electrode layer 132 to the conductivity of the first common electrode layer 131 may be in a range of 10 to 100. Accordingly, the overall resistance value of the common electrode 130 may be effectively reduced so that the current conduction efficiency of the common electrode 130 may be improved. It is specifically noted that the material of the second common electrode layer 132 may be the same as the material of the second-type electrode 122, and both may be completed in the same process to increase manufacturing efficiency.

Moreover, a thickness t1 of the first common electrode layer 131 in a direction (e.g., the direction Z) perpendicular to the surface 100s of the circuit substrate 100 is less than a thickness t2 of the second common electrode layer 132 in the direction Z. From another point of view, by increasing the thickness t2 of the second common electrode layer 132 to increase the conductivity thereof, the thickness t1 of the first common electrode layer 131 may be further reduced, thus improving the visible light transmittance of the first common electrode layer 131. In other words, the difference in material selection and film thickness between the two common electrode layers may not only improve the current conduction efficiency of the common electrode 130, but also make the visible light transmittance of the first common electrode layer 131 greater than the visible light transmittance of the second common electrode layer 132 to improve the light emitting efficiency of the micro light emitting devices 120.

For example, in the present embodiment, the second common electrode layer 132 has a width W1 in the direction X, two adjacent micro light emitting devices 120 arranged in the direction X have a maximum pitch S1 and a minimum pitch S2 in a direction X1, the width W1 of the second common electrode layer 132 may be substantially equal to the minimum pitch S2 between the two adjacent micro light emitting devices 120, and is less than the maximum pitch S1 between the two adjacent micro light emitting devices 120, but the invention is not limited thereto. In particular, the ratio of the width W1 of the second common electrode layer 132 to the maximum pitch S1 between the two adjacent micro light emitting devices 120 is greater than or equal to 0.5, thus effectively increasing the current conduction efficiency of the common electrode 130. Moreover, the ratio of the width W1 of the second common electrode layer 132 to the minimum pitch S2 between the two adjacent micro light emitting devices 120 may be greater than or equal to 0.5 and less than or equal to 2. Accordingly, while improving the current conduction efficiency of the common electrode 130, the overall production yield of the micro light-emitting device display apparatus 10 may be ensured, thus achieving a high-resolution display effect.

In the present embodiment, the width W1 of the second common electrode layer 132 may be greater than a width W2 of the first-type electrode 121 of the micro light emitting devices 120 in the direction X, so that the common electrode 130 may have better current conduction efficiency, but the invention is not limited thereto. In other embodiments, the width W1 of the second common electrode layer 132 may also be equal to the width W2 of the first-type electrode 121 of the micro light emitting devices 120. Moreover, in the present embodiment, the thickness t2 of the second common electrode layer 132 in a direction (e.g., the direction Z) perpendicular to the surface 100s of the circuit substrate 100 is less than a thickness t3 of the first-type electrode 121 of the micro light emitting devices 120 in the direction Z to reduce the process complexity of the second common electrode layer 132. However, the invention is not limited thereto. In another embodiment not shown, the thickness t2 of the second common electrode layer 132 in the direction Z may also be substantially equal to the thickness t3 of the first-type electrode 121 in the direction Z.

Moreover, the conductivity of the first common electrode layer 131 may be less than the conductivity of the first-type electrode 121. For example, when the materials of the first common electrode layer 131 and the first-type electrode 121 are both transparent metal oxides, the current conduction efficiency of the common electrode 130 may be increased by the second common electrode layer 132. Therefore, the thickness t1 of the first common electrode layer 131 may be optionally less than the thickness t3 of the first-type electrode 121, so that the visible light transmittance of the first common electrode layer 131 is greater than the visible light transmittance of the first-type electrode 121 to improve the overall light emitting efficiency of the micro light-emitting devices 120.

It is worth noting that, in the present embodiment, the micro light emitting device display apparatus 10 further includes a gap G located between the plurality of micro light emitting devices 120, the isolation layer 140, and the circuit substrate 100. For example, before the plurality of micro light emitting devices 120 are transferred to the circuit substrate 100, the isolation layer 140 may be formed between the micro light emitting devices 120 first to connect the micro light emitting devices 120. That is, the material of the isolation layer 140 may have a certain adhesion to stabilize the connection relationship between the micro light emitting devices 120. Via the connection of the isolation layer 140 to the plurality of micro light emitting devices 120, the transfer yield of the micro light emitting devices 120 may be increased. In particular, the isolation layer 140 may be a light-blocking material, such as a black photoresist or a scattering material to prevent the side lights of the micro light emitting devices 120 from interfering with each other and/or to increase the amount of forward light thereof.

Moreover, during the process in which the micro light emitting devices 120 are transferred to the circuit substrate 100 and electrically bonded to the plurality of connection pads 110, the connection pads 110 may be heated to a molten state. At this time, since the pitch between the micro light emitting devices 120 is less, the gap G formed between the plurality of micro light emitting devices 120, the isolation layer 140, and the circuit substrate 100 may be used as a buffer space when the connection pads 110 are overflown to avoid a short circuit between the micro light emitting devices 120 (or the connection pads 110) and to increase the flatness of the micro light emitting devices 120 bonded to the circuit substrate 100, thereby improving the manufacturing yield of the first common electrode layer 131 in a subsequent process. It should be noted that the second common electrode layer 132 of the common electrode 130 may be manufactured on the isolation layer 140 before the micro light emitting devices 120 are transferred to the circuit substrate 100, but the invention is not limited thereto.

Further, the micro light emitting device display apparatus 10 may further include a first driving circuit 150 and a second driving circuit 160 respectively disposed on two adjacent sides of the circuit substrate 100. For example, a transistor device used to control the display pixels (that is, the micro light-emitting devices 120) is respectively electrically connected to the first driving circuit 150 (such as a gate driving circuit) and a second driving circuit 160 (for example, a source driving circuit) via a scan line and a data line. Moreover, the micro light emitting device display apparatus 10 may further include a driving circuit board 170, and the driving circuit board 170 may be electrically bonded to one side of the circuit substrate 100 to be electrically connected to the first driving circuit 150 and the second driving circuit 160. For example, the driving circuit board 170 may be electrically connected to the circuit substrate 100 via a flexible printed circuit board (FPCB; not shown), but the invention is not limited thereto.

It should be noted that, in the present embodiment, the number of driving circuits is two as an example, but does not mean that the invention is limited by the contents disclosed in the figures. In other embodiments, the micro light emitting device display apparatus may further include a power control circuit or other circuits (e.g., a feedback circuit, a compensation circuit, etc.) suitable for driving display pixels. It should be understood that the micro light emitting device display apparatus may further include a signal line electrically connected to the driving circuit.

Figure 3:
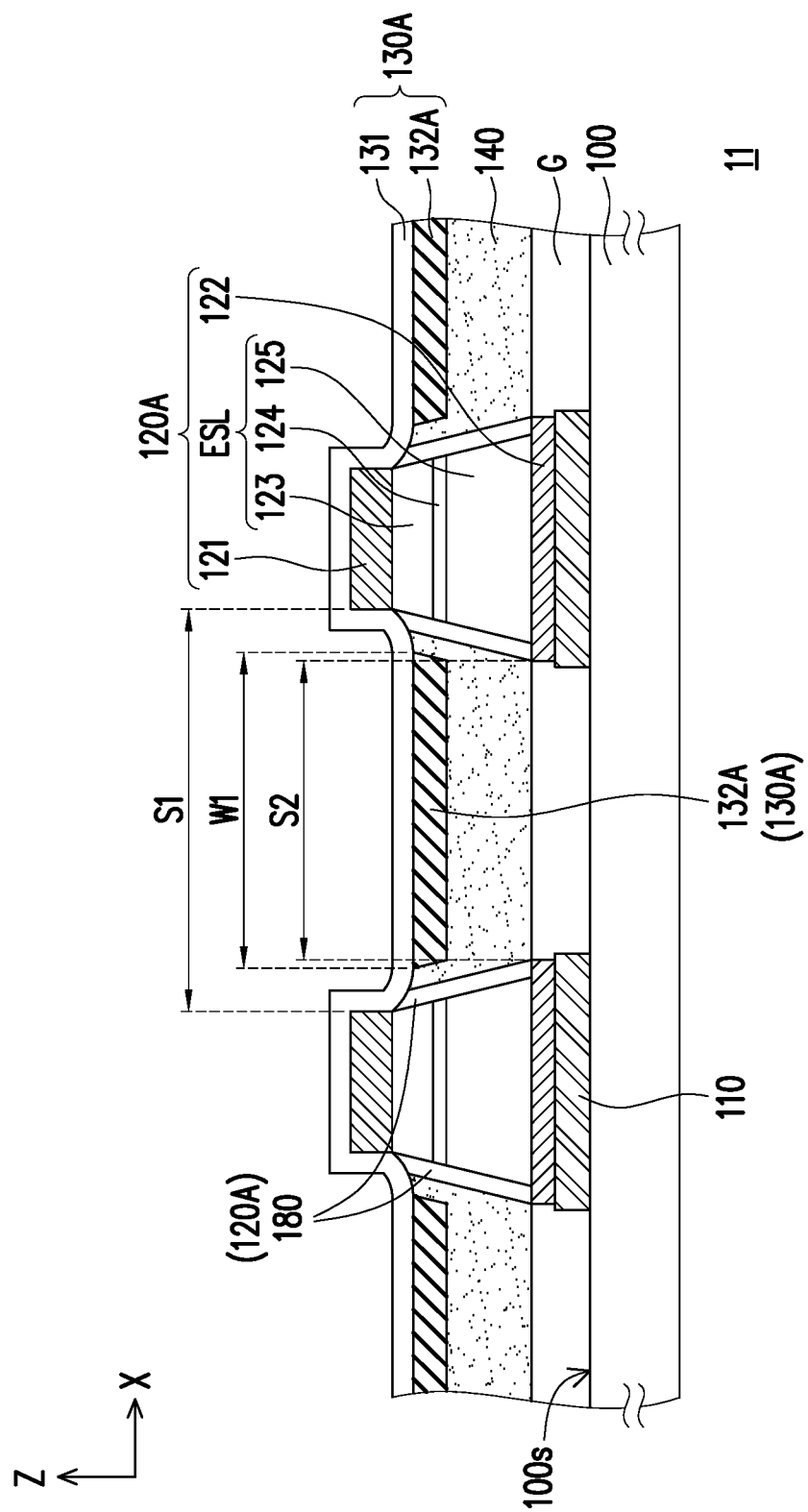
FIG. 3 is a cross-sectional view of a micro light emitting device display apparatus of the second embodiment of the invention.

FIG. 3 is a cross-sectional view of a micro light emitting device display apparatus of the second embodiment of the invention. Referring to FIG. 3, the main difference between a micro light emitting device display apparatus 11 of the present embodiment and the micro light emitting device display apparatus 10 of FIG. 2 is that the composition of the micro light emitting devices is different and the size and arrangement relationship of the second common electrode layer are different. Specifically, micro light emitting devices 120A of the micro light emitting device display apparatus 11 may further include an insulating layer 180 disposed between the isolation layer 140 and the epitaxial structure ESL. In the present embodiment, the insulating layer 180 may directly cover the sidewalls of the second-type semiconductor layer 125, the light emitting layer 124, and a portion of the first-type semiconductor layer 123 of the epitaxial structure ESL, but the invention is not limited thereto. Accordingly, a leakage current may be prevented from being generated at the connection surface of the epitaxial structure ESL and the isolation layer 140. More specifically, a second common electrode layer 132A of a common electrode 130A may be ensured to be electrically insulated from the light emitting layer 124 and the second-type semiconductor layer 125.

In the present embodiment, the material of the insulating layer 180 may include an insulating material of aluminum oxide, aluminum nitride, silicon oxide, or silicon nitride, but is not limited thereto. Moreover, in the present embodiment, the second common electrode layer 132A of the common electrode 130A may be overlapped with the light emitting layer 124 in a direction (for example, the direction X) parallel to the circuit substrate 100, and the width W1 of the second common electrode layer 132A in the direction X is greater than the minimum pitch S2 between two adjacent micro light emitting devices 120A in the direction X. In other words, the second common electrode layer 132A of the present embodiment is closer to the light emitting layer 124 of the epitaxial structure ESL than the second common electrode layer 132 of the embodiment of FIG. 2 so that the side emission of the light emitting layer 124 may be reflected to the angle range of the forward light output via the sidewall of the second common electrode layer 132A to increase the forward light output of the micro light emitting devices 120A.

Figure 4:
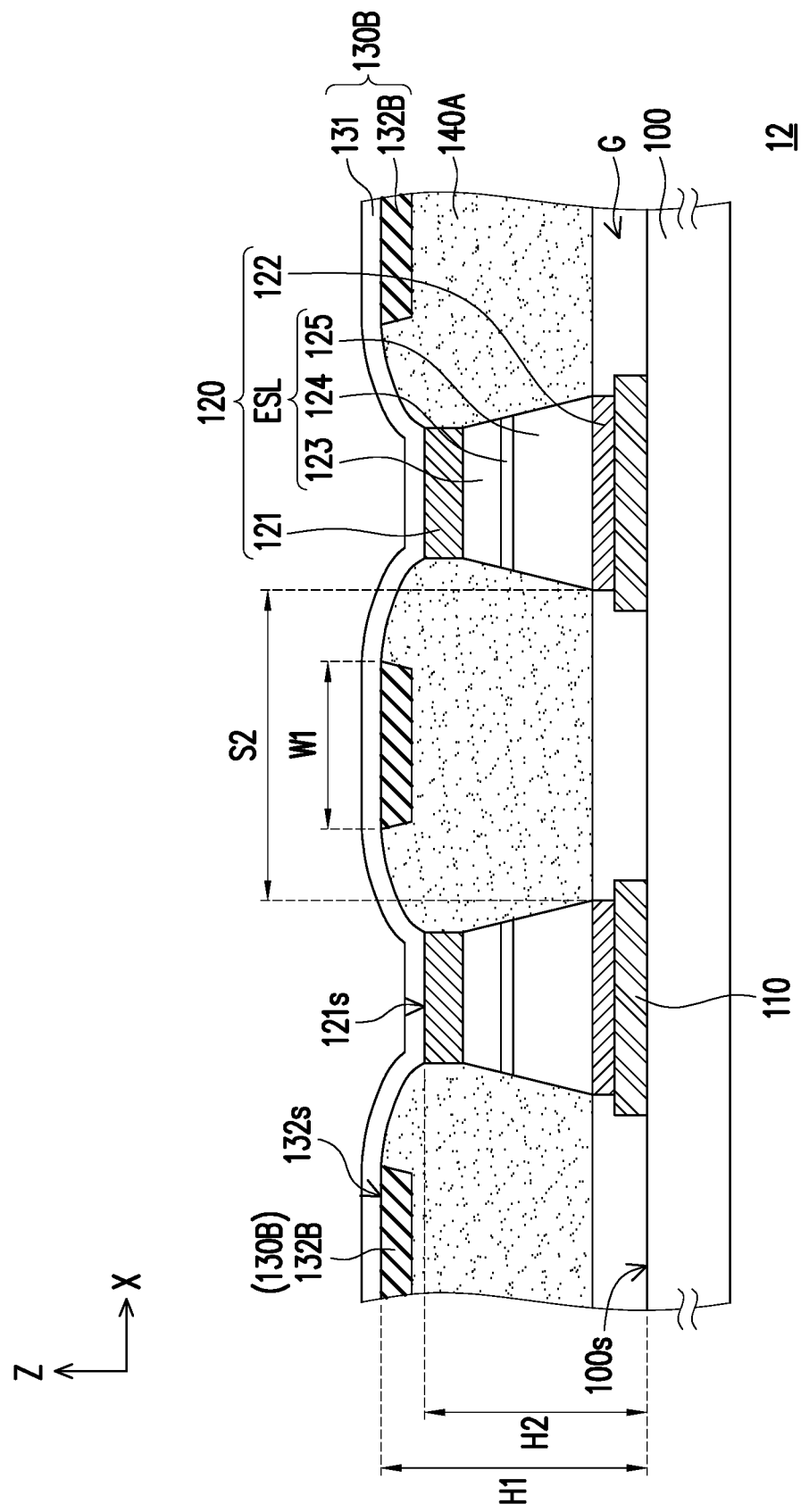
FIG. 4 is a cross-sectional view of a micro light emitting device display apparatus of the third embodiment of the invention.

FIG. 4 is a cross-sectional view of a micro light emitting device display apparatus of the third embodiment of the invention. Referring to FIG. 4, the difference between a micro light emitting device display apparatus 12 of the present embodiment and the micro light emitting device display apparatus 10 of FIG. 2 is that the configuration of the second common electrode layer is different. Specifically, in the present embodiment, there is a first height H1 between a surface 132s of a second common electrode layer 132B of a common electrode 130B connected to the first common electrode layer 131 and the circuit substrate 100, there is a second height H2 between a surface 121s of the first-type electrode 121 connected to the first common electrode layer 131 and the circuit substrate 100, and an isolation layer 140A may be protruded from between the plurality of first-type electrodes 121 of the plurality of micro light emitting devices 120. The first height H1 of the second common electrode layer 132B is greater than the second height H2 of the first-type electrode 121 to block the large-angle light emission of the micro light emitting devices 120, thereby preventing the emission ranges of adjacent micro light-emitting devices 120 from overlapping with each other so as to achieve high-resolution display effects. The isolation layer 140A may be a material blocking light or a scattering material to better improve the forward light output of the micro light emitting device display apparatus.

Moreover, in the present embodiment, the width W1 of the second common electrode layer 132B in the direction X may be less than the minimum pitch S2 between two adjacent micro light emitting devices 120, but the invention is not limited thereto. In other embodiments, the relationship between the width W1 of the second common electrode layer 132B and the minimum pitch S2 may also be adjusted based on the first height H1 of the second common electrode layer 132B or the actual product specifications (such as the resolution of display pixels), and the invention is not limited in this regard.

Figure 5:
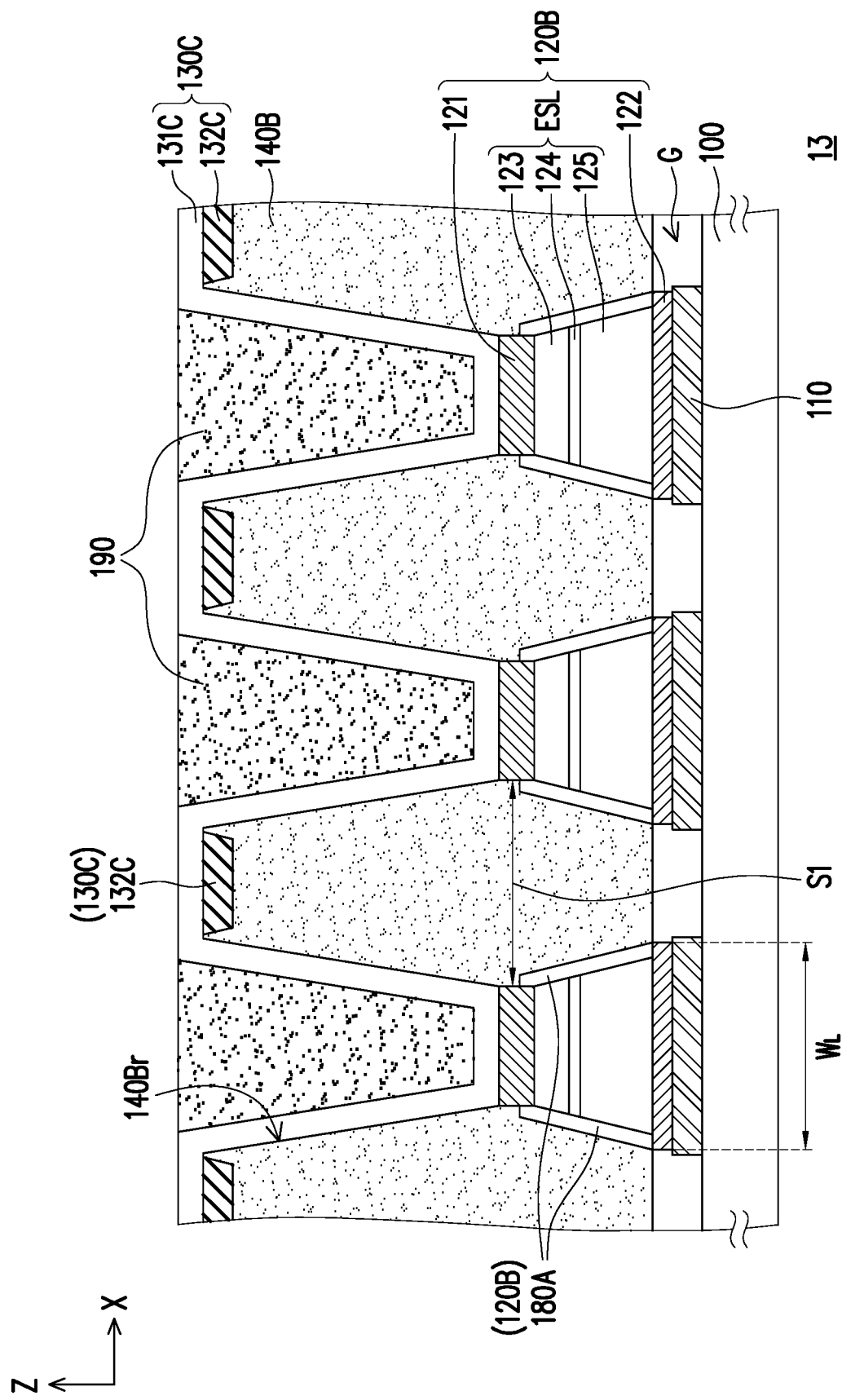
FIG. 5 is a cross-sectional view of a micro light emitting device display apparatus of the fourth embodiment of the invention.

FIG. 5 is a cross-sectional view of a micro light emitting device display apparatus of the fourth embodiment of the invention. Referring to FIG. 5, the main difference between a micro light emitting device display apparatus 13 of the present embodiment and the micro light emitting device display apparatus 10 of FIG. 2 is that the configuration of the isolation layer, the composition of the micro light emitting devices, and the composition of the display apparatus are different. In the present embodiment, an isolation layer 140B has a plurality of grooves 140Br, and the grooves 140Br are correspondingly disposed on a plurality of micro light emitting devices 120B. More specifically, the grooves 140Br are overlapped with the plurality of micro light emitting devices 120B in the direction Z, and a first common electrode layer 131C of a common electrode 130C is extended into the grooves 140Br to be electrically connected to the first-type electrode 121 of the micro light emitting devices 120B. The micro light emitting device display apparatus 13 further includes a wavelength conversion layer 190 filled in the plurality of grooves 140Br, and the first common electrode layer 131C is located between the isolation layer 140B and the wavelength conversion layer 190.

For example, the micro light emitting devices 120B of the present embodiment are used to emit a single wavelength of excitation light (such as blue light or ultraviolet light), and the excitation light is irradiated on the wavelength conversion layer 190 to excite red light, green light, or other visible light. However, the invention is not limited thereto. According to other embodiments, a color filter layer may also be provided in the grooves 140Br of the isolation layer 140B to filter the visible light emitted by the micro light emitting devices 120B into a desired color light.

In the present embodiment, the maximum pitch S1 between two adjacent micro light emitting devices 120B in the direction X may be less than the maximum width $W_L$ of the micro light emitting devices 120B in the direction X. In other words, the micro light emitting device display apparatus 13 of the present embodiment may be a micro light emitting diode display panel having a higher pixel resolution. Moreover, the micro light emitting devices 120B may further include an insulating layer 180A disposed between the isolation layer 140B and the epitaxial structure ESL. The insulating layer 180A may directly cover the epitaxial structure ESL and a portion of the sidewall of the first-type electrode 121, but is not limited thereto. Accordingly, a leakage current may be prevented from being generated at the connection surface of the epitaxial structure ESL and the isolation layer 140B. More specifically, electrically insulation of any two adjacent micro light emitting devices 120B from each other may be ensured.

Figure 6:
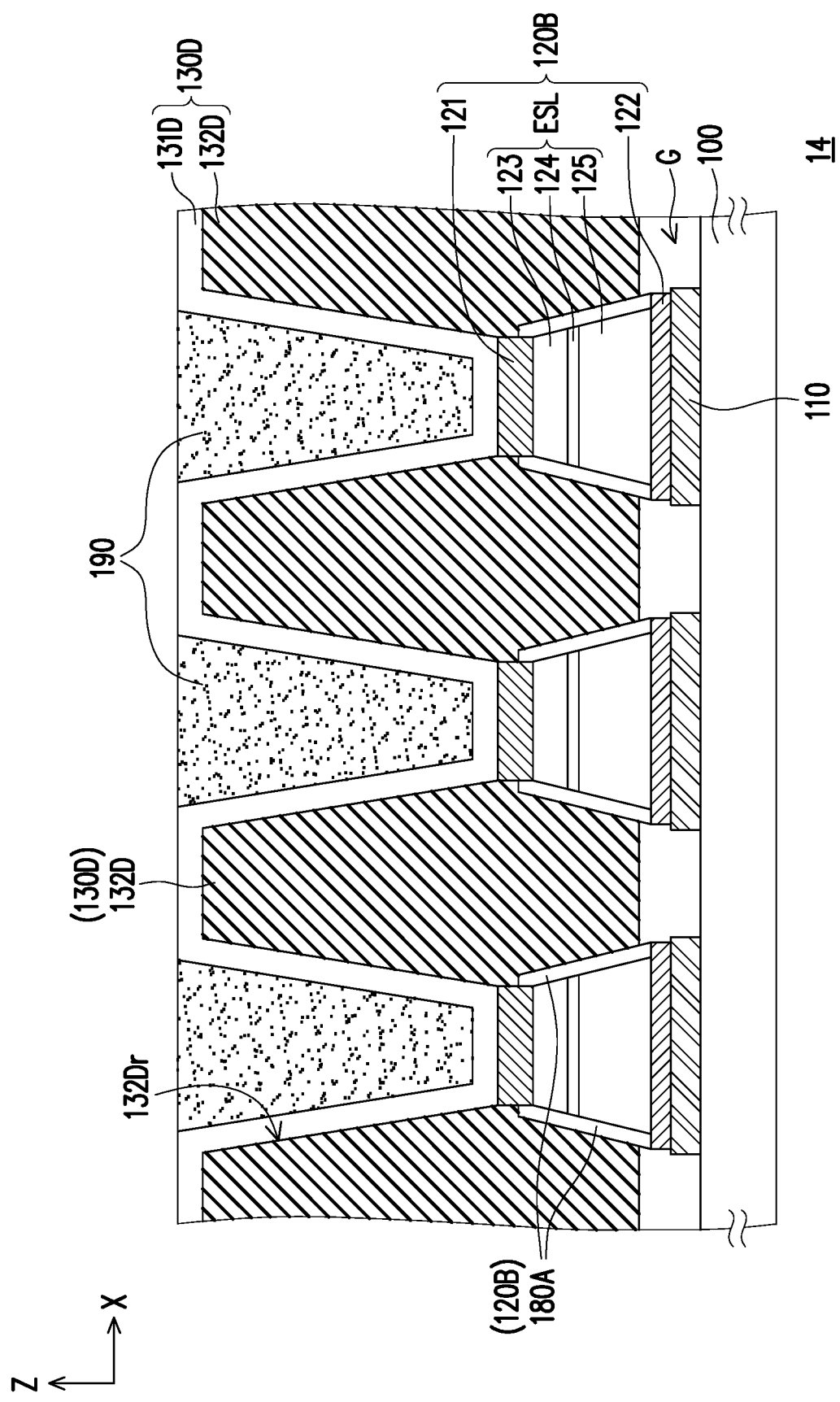
FIG. 6 is a cross-sectional view of a micro light emitting device display apparatus of the fifth embodiment of the invention.

FIG. 6 is a cross-sectional view of a micro light emitting device display apparatus of the fifth embodiment of the invention. Referring to FIG. 6, the main difference between a micro light emitting device display apparatus 14 of the present embodiment and the micro light emitting device display apparatus 13 of FIG. 5 is that the structure of the second common electrode layer is different. In the present embodiment, a second common electrode layer 132D has a plurality of grooves 132Dr, and the grooves 132Dr are correspondingly disposed on the plurality of micro light emitting devices 120B. More specifically, the grooves 132Dr are overlapped with the plurality of micro light emitting devices 120B in the direction Z, and a first common electrode layer 131D of a common electrode 130D is extended into the grooves 132Dr to be electrically connected to the first-type electrode 121 of the micro light emitting devices 120B. The wavelength conversion layer 190 of the micro light emitting device display apparatus 14 is filled in the grooves 132Dr, and the first common electrode layer 131D is located between the second common electrode layer 132D and the wavelength conversion layer 190. The material of the second common electrode layer 132D may be a material having reflective and conductive characteristics such as silver, gold, chromium, copper, platinum, tin, nickel, titanium, aluminum, or an alloy of the above metals. Via the design of forming the plurality of grooves 132Dr via the second common electrode layer 132D, light output may be concentrated.

For example, the micro light emitting devices 120B of the present embodiment are used to emit a single wavelength of excitation light (such as blue light or ultraviolet light), and the excitation light is irradiated on the wavelength conversion layer 190 to excite red light, green light, or other visible light. However, the invention is not limited thereto. According to other embodiments, a color filter layer may also be provided in the grooves 132Dr of the second common electrode layer 132D to filter the visible light emitted by the micro light emitting devices 120B into a desired color light. In addition, the material of the second common electrode layer 132D may be a material having reflective and conductive characteristics. Therefore, the light emitted from two adjacent micro light emitting devices 120B may be prevented from interfering with each other, and the common electrode 130D may also have good conduction efficiency. In particular, the material of the second common electrode layer 132D may be the same as the material of the second-type electrode 122, both of which may be completed in the same process, and a light-blocking layer is not needed in a subsequent process to increase process efficiency.

Figure 7:
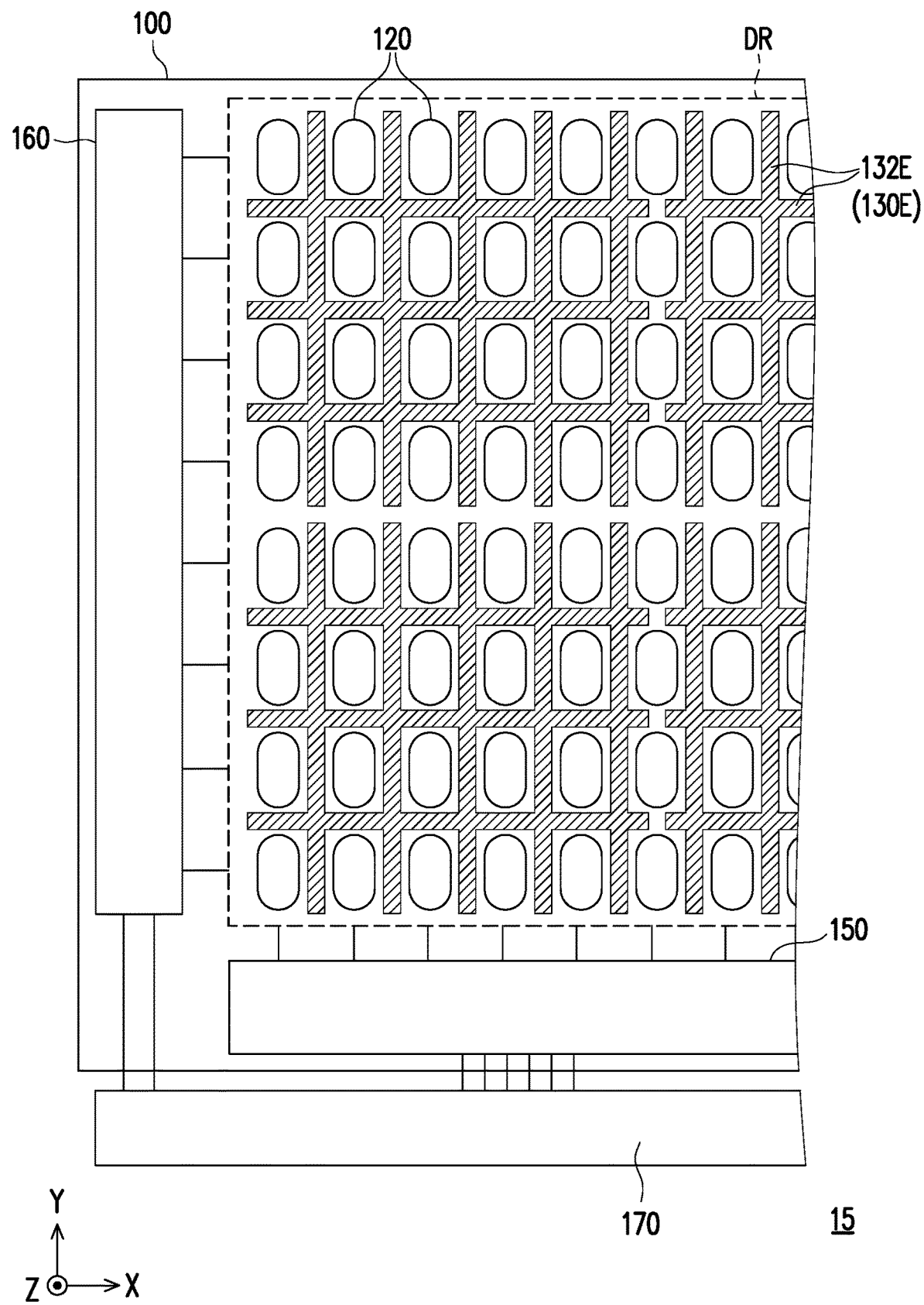
FIG. 7 is a top view of a micro light emitting device display apparatus of the sixth embodiment of the invention.
Figure 8:
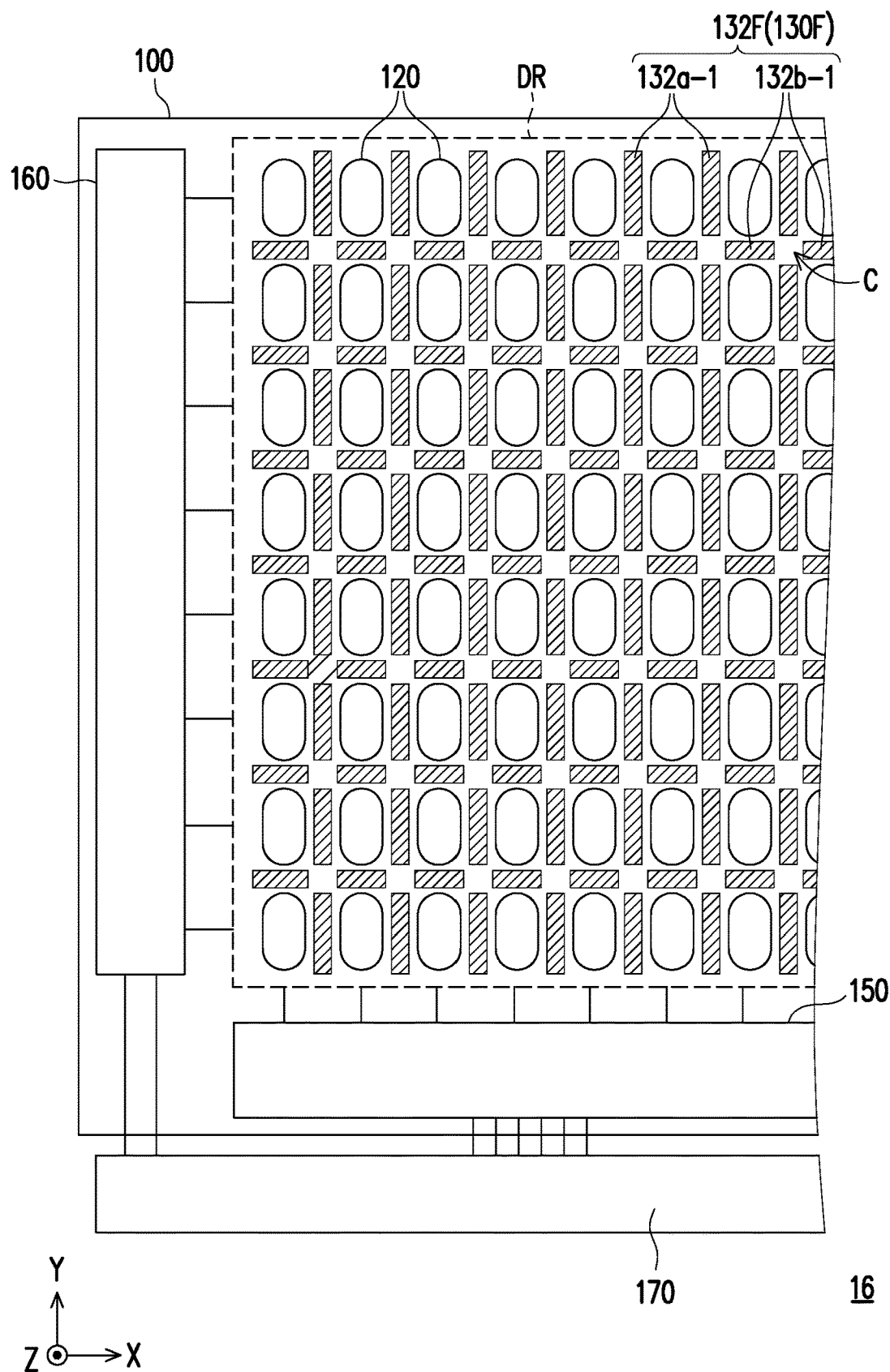
FIG. 8 is a top view of a micro light emitting device display apparatus of the seventh embodiment of the invention.
Figure 9:
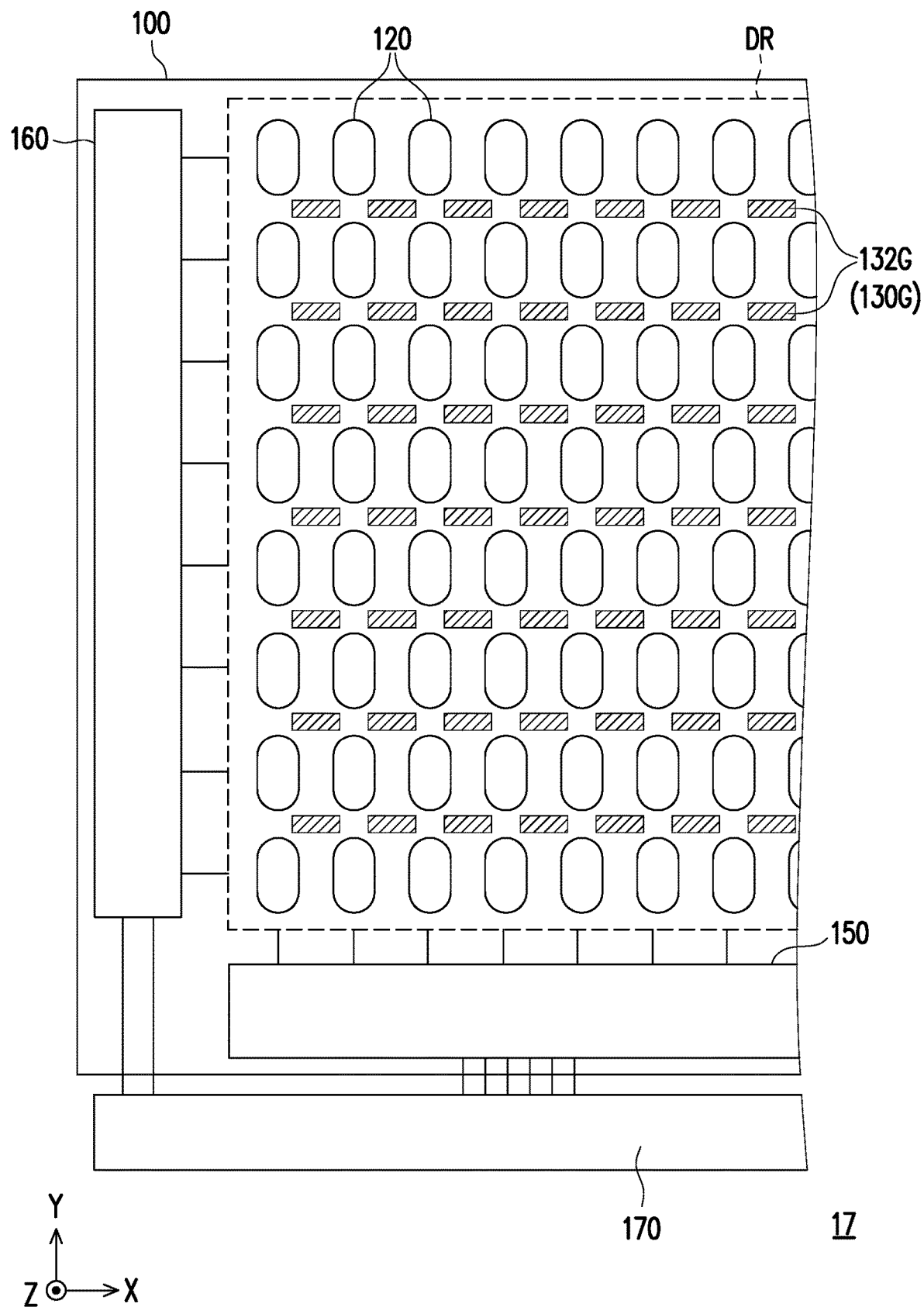
FIG. 9 is a top view of a micro light emitting device display apparatus of the eighth embodiment of the invention.

FIG. 7 is a top view of a micro light emitting device display apparatus of the sixth embodiment of the invention. FIG. 8 is a top view of a micro light emitting device display apparatus of the seventh embodiment of the invention. FIG. 9 is a top view of a micro light emitting device display apparatus of the eighth embodiment of the invention. Please refer to FIG. 7, FIG. 8, and FIG. 9. A micro light emitting device display apparatus 15, a micro light emitting device display apparatus 16, and a micro light emitting device display apparatus 17 are all similar to the micro light emitting device display apparatus 10 of FIG. 1, and the main differences is that the arrangement of the second common electrode layer is different.

Specifically, a second common electrode layer 132E of a common electrode 130E of the micro light emitting device display apparatus 15 may be formed by a plurality of grid-shaped conductive patterns separated from each other in structure (as shown in FIG. 7), but the invention is not limited thereto. In another embodiment, first straight line segments 132a-1 (or second straight line segments 132b-1) of a second common electrode layer 132F of a common electrode 130F of the micro light emitting device display apparatus 16 may also be formed by a plurality of strip-shaped conductive patterns separated from each other in structure, as shown in FIG. 8. More specifically, the second common electrode layer 132F has a plurality of disconnections C, and the disconnections C are located between four micro light emitting devices 120 adjacent to each other (or the intersections of the plurality of straight-line segments 132a and the plurality of second straight line segments 132b as shown in FIG. 1).

Referring to FIG. 9, a second common electrode layer 132G of a common electrode 130G of the micro light emitting device display apparatus 17 of the present embodiment may be formed by a plurality of strip-shaped conductive patterns structurally separated from each other, and the strip-shaped conductive patterns are located between the four micro light emitting devices 120 adjacent to each other. More specifically, the strip-shaped conductive patterns and the plurality of micro light emitting devices 120 are alternately arranged in the direction X and the direction Y. Via the dislocation relationship between the strip-shaped conductive patterns and the micro light emitting devices 120 in the two directions, the process margin of the second common electrode layer 132G may be increased. For example, the offset tolerance of the second common electrode layer 132G may be increased in the direction X and the direction Y at the same time to improve the overall yield of the micro light emitting device display apparatus 17.

Based on the above, in the micro light emitting device display apparatus of an embodiment of the invention, the common electrode of the plurality of first-type electrodes electrically connected to the plurality of micro light emitting devices is a stacked structure formed by the first common electrode layer and the second common electrode layer. Via the electrical connection between the first common electrode layer and the second common electrode layer disposed between the micro light emitting devices, the overall resistance of the common electrode may be effectively reduced, thus improving the current conduction efficiency of the common electrode.

What is claimed is:

1. A micro light emitting device display apparatus, comprising:
    a circuit substrate;
    a plurality of micro light emitting devices disposed on the circuit substrate, and each of the micro light emitting devices comprises:
    an epitaxial structure; and
    a first-type electrode and a second-type electrode respectively disposed on two side surfaces of the epitaxial structure opposite to each other;
    a first common electrode layer disposed on the circuit substrate and directly covering the first-type electrodes of the micro light emitting devices;
    a second common electrode layer disposed between the micro light emitting devices, wherein the first common electrode layer is electrically connected to the second common electrode layer;
    an isolation layer disposed between the micro light emitting devices, wherein the first common electrode layer is disposed on the isolation layer, and the second common electrode layer is located between the first common electrode layer and the isolation layer; and
    a gap located between the micro light emitting devices, the isolation layer, and the circuit substrate.

2. The micro light emitting device display apparatus of claim 1, wherein a conductivity of the second common electrode layer is higher than a conductivity of the first common electrode layer.

3. The micro light emitting device display apparatus of claim 1, wherein a visible light transmittance of the first common electrode layer is greater than a visible light transmittance of the second common electrode layer.

4. The micro light emitting device display apparatus of claim 1, wherein a thickness of the first common electrode layer is less than a thickness of the second common electrode layer.

5. The micro light emitting device display apparatus of claim 1, wherein a material of the first common electrode layer comprises a metal oxide, and a material of the second common electrode layer comprises a metal or an alloy.

6. The micro light emitting device display apparatus of claim 1, wherein the second common electrode layer has a width in a first direction, two adjacent micro light emitting devices have a maximum pitch and a minimum pitch in the first direction, and the width of the second common electrode layer is greater than or equal to the minimum pitch and less than the maximum pitch.

7. The micro light emitting device display apparatus of claim 6, wherein a ratio of the width of the second common electrode layer to the maximum pitch is greater than or equal to 0.5.

8. The micro light emitting device display apparatus of claim 6, wherein a ratio of the width of the second common electrode layer to the minimum pitch is greater than or equal to 0.5 and less than or equal to 2.

9. The micro light emitting device display apparatus of claim 1, wherein a width of the second common electrode layer in a first direction is greater than or equal to a width of the first-type electrode in the first direction.

10. The micro light emitting device display apparatus of claim 1, wherein a thickness of the second common electrode layer is less than or equal to a thickness of the first-type electrode.

11. The micro light emitting device display apparatus of claim 1, wherein a conductivity of the first common electrode layer is less than a conductivity of the first-type electrode.

12. The micro light emitting device display apparatus of claim 11, wherein a visible light transmittance of the first common electrode layer is greater than a visible light transmittance of the first-type electrode.

13. The micro light emitting device display apparatus of claim 1,
    wherein there is a first height between a surface of the second common electrode layer connected to the first common electrode layer and the circuit substrate, there is a second height between a surface of the first-type electrode connected to the first common electrode layer and the circuit substrate, and the first height is greater than the second height.

14. The micro light emitting device display apparatus of claim 13, further comprising:
    a wavelength conversion layer disposed between the second common electrode layer, wherein the isolation layer has a plurality of grooves correspondingly disposed on the micro light emitting devices, and the wavelength conversion layer is filled in the grooves.

15. The micro light emitting device display apparatus of claim 1, wherein each of the micro light emitting devices further comprises:
    an insulating layer disposed between the epitaxial structure and the isolation layer and covering at least a portion of the epitaxial structure.

16. The micro light emitting device display apparatus of claim 1, wherein the micro light emitting device has a minimum width and a maximum width in a first direction, and a ratio of the minimum width to the maximum width of the micro light emitting device is less than or equal to 0.5 and greater than or equal to 0.05.

17. The micro light emitting device display apparatus of claim 1, wherein the micro light emitting device has a maximum width in a first direction, two adjacent micro light emitting devices have a maximum pitch in the first direction, and the maximum pitch is less than the maximum width of the micro light emitting device.

18. The micro light emitting device display apparatus of claim 1, wherein the epitaxial structure comprises a first-type semiconductor layer, a light emitting layer, and a second-type semiconductor layer, the light emitting layer is located between the first-type semiconductor layer and the second-type semiconductor layer, and the second common electrode layer is overlapped with the light emitting layer in a direction parallel to the circuit substrate.

19. The micro light emitting device display apparatus of claim 1, wherein the second common electrode layer has a plurality of grooves correspondingly provided on the micro light emitting devices.

20. The micro light emitting device display apparatus of claim 19, further comprising: a wavelength conversion layer disposed between the second common electrode layer, and the wavelength conversion layer is filled in the grooves.

* * * * *